(12) United States Patent
Hasumi (10) Patent No.: US 12,326,213 B2
(45) Date of Patent: Jun. 10, 2025

(54) FLUID CHECK PIPING AND ELECTRIC POWER APPARATUS

(71) Applicant: TOSHIBA MITSUBISHI-ELECTRIC INDUSTRIAL SYSTEMS CORPORATION, Chuo-ku (JP)

(72) Inventor: Satoshi Hasumi, Tokyo (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 17/999,651

(22) PCT Filed: Apr. 16, 2021

(86) PCT No.: PCT/JP2021/015682
§ 371 (c)(1),
(2) Date: Nov. 22, 2022

(87) PCT Pub. No.: WO2022/219796
PCT Pub. Date: Oct. 20, 2022

(65) Prior Publication Data
US 2024/0337341 A1  Oct. 10, 2024

(51) Int. Cl.
*F16L 55/00* (2006.01)
(52) U.S. Cl.
CPC ........... *F16L 55/00* (2013.01); *F16L 2201/40* (2013.01)
(58) Field of Classification Search
CPC ......... F16L 55/00; F16L 2201/40; G01F 1/22; G01F 1/26; G01F 1/28
USPC ..... 138/103, 104; 73/740, 861, 75; 137/486, 137/488; 116/275, 276
See application file for complete search history.

(56) References Cited

U.S. PATENT DOCUMENTS

| | | | | |
|---|---|---|---|---|
| 316,110 A | * | 4/1885 | Beckwith | F16K 15/03 116/276 |
| 2,029,633 A | * | 2/1936 | Muhleisen | G01P 13/0026 137/527 |
| 3,085,432 A | * | 4/1963 | Bloom | G01P 13/0026 73/861.75 |

(Continued)

FOREIGN PATENT DOCUMENTS

JP        9-304136 A    11/1997
JP  10-2004-0066649 A    7/2004

(Continued)

OTHER PUBLICATIONS

International Search Report mailed on Jun. 22, 2021 in PCT/JP2021/015682 filed on Apr. 16, 2021 (5 pages).

*Primary Examiner* — David R Deal
(74) *Attorney, Agent, or Firm* — Oblon, McClelland, Maier & Neustadt, L.L.P.

(57) ABSTRACT

A fluid check piping of an embodiment includes a piping main body, a check window, and a check plate. The piping main body is arranged along a horizontal direction, and a fluid flows through an inside of the piping main body. The check window is provided on an upper portion of a circumferential wall of the piping main body, and the inside of the piping main body is capable of being viewed from an outside of the piping main body. The check plate is provided on an inner circumferential surface of the piping main body, is rotatably arranged side-by-side with the check window, droops by its own weight, and rises so as to block the check window in response to a pressure of the fluid.

2 Claims, 6 Drawing Sheets

(56) References Cited

U.S. PATENT DOCUMENTS

| | | | | | |
|---|---|---|---|---|---|
| 3,251,335 | A | * | 5/1966 | Dannevik | G01F 1/28 |
| | | | | | 73/861.75 |
| 3,452,169 | A | * | 6/1969 | Ruxton | G01F 1/26 |
| | | | | | 200/81.9 R |
| 3,745,967 | A | * | 7/1973 | Smith | G01F 1/28 |
| | | | | | 73/861.75 |
| 3,857,277 | A | * | 12/1974 | Moore | G01F 1/26 |
| | | | | | 116/276 |
| 3,914,994 | A | * | 10/1975 | Banner | G01P 13/0033 |
| | | | | | 137/554 |
| 4,484,536 | A | * | 11/1984 | Henocque | G01P 13/008 |
| | | | | | 137/557 |
| 5,038,820 | A | * | 8/1991 | Ames | F16K 31/02 |
| | | | | | 137/460 |
| 5,063,775 | A | * | 11/1991 | Walker, Sr | E21B 47/009 |
| | | | | | 73/152.52 |
| 7,921,726 | B2 | * | 4/2011 | Ellegood | G01P 5/04 |
| | | | | | 73/740 |
| 8,800,473 | B1 | * | 8/2014 | DeVerse | G01F 15/063 |
| | | | | | 116/276 |
| 11,513,025 | B1 | * | 11/2022 | Warsowe | G01F 1/28 |
| 2003/0000575 | A1 | * | 1/2003 | Allen | G05D 11/006 |
| | | | | | 137/118.04 |

FOREIGN PATENT DOCUMENTS

| | | | |
|---|---|---|---|
| JP | 2007-180458 | A | 7/2007 |
| JP | 2007-278899 | A | 10/2007 |
| JP | 2007-294887 | A | 11/2007 |
| JP | 2010-5503 | A | 1/2010 |
| JP | 2011-206158 | A | 10/2011 |
| JP | 2019-525192 | A | 9/2019 |

* cited by examiner

FLUID CHECK PIPING AND ELECTRIC POWER APPARATUS

TECHNICAL FIELD

An embodiment of the present invention relates to fluid check piping and an electric power apparatus.

BACKGROUND

An electric power apparatus or the like that includes electrical equipment (for example, an electric power conversion unit) accommodated within a housing may include a water-cooled cooling unit in order to cool the electrical equipment that easily generates heat. The cooling unit includes a water passage constituted of a piping provided around the electrical equipment. The electrical equipment is cooled by causing cooling water which serves as a refrigerant to flow into the piping.

For example, it is assumed that foreign substances enter the piping, and the cooling water does not flow properly in the piping. In view of such circumstances, various techniques have been proposed for viewing the flow of the cooling water in the piping.

For example, a technique is disclosed in which a window for viewing an inside of a piping from an outside is provided (for example, refer to Patent Document 1).

Further, a technique that includes an impeller which is provided in a piping and rotates in response to the pressure of a fluid is disclosed (for example, refer to Patent Document 2).

However, in a case where a window is simply provided, when the fluid (cooling water) in the water passage is transparent, it may be difficult to check the condition of the fluid in the piping. There is a problem in that when an impeller or the like is provided, the manufacturing cost increases accordingly.

RELATED ART DOCUMENTS

Patent Documents

Patent Document 1

Published Japanese Translation No. 2019-525192 of the PCT International Publication Patent Document 2

Japanese Unexamined Patent Application, First Publication No. 2010-5503

SUMMARY OF INVENTION

Problems to be Solved by the Invention

A problem to be solved by the present invention is to provide a fluid check piping and an electric power apparatus that can reliably check the condition of an internal fluid and can be manufactured with a low cost.

Means for Solving the Problem

A fluid check piping of an embodiment includes a piping main body, a check window, and a check plate. The piping main body is arranged along a horizontal direction, and a fluid flows through an inside of the piping main body. The check window is provided on an upper portion of a circumferential wall of the piping main body, and the inside of the piping main body is capable of being viewed from an outside of the piping main body. The check plate is provided on an inner circumferential surface of the piping main body, is rotatably arranged side-by-side with the check window, droops by its own weight, and rises so as to block the check window in response to a pressure of the fluid.

DESCRIPTION OF THE EMBODIMENTS

Hereinafter, a fluid check piping and an electric power apparatus according to an embodiment will be described with reference to the drawings.

Figure 1:
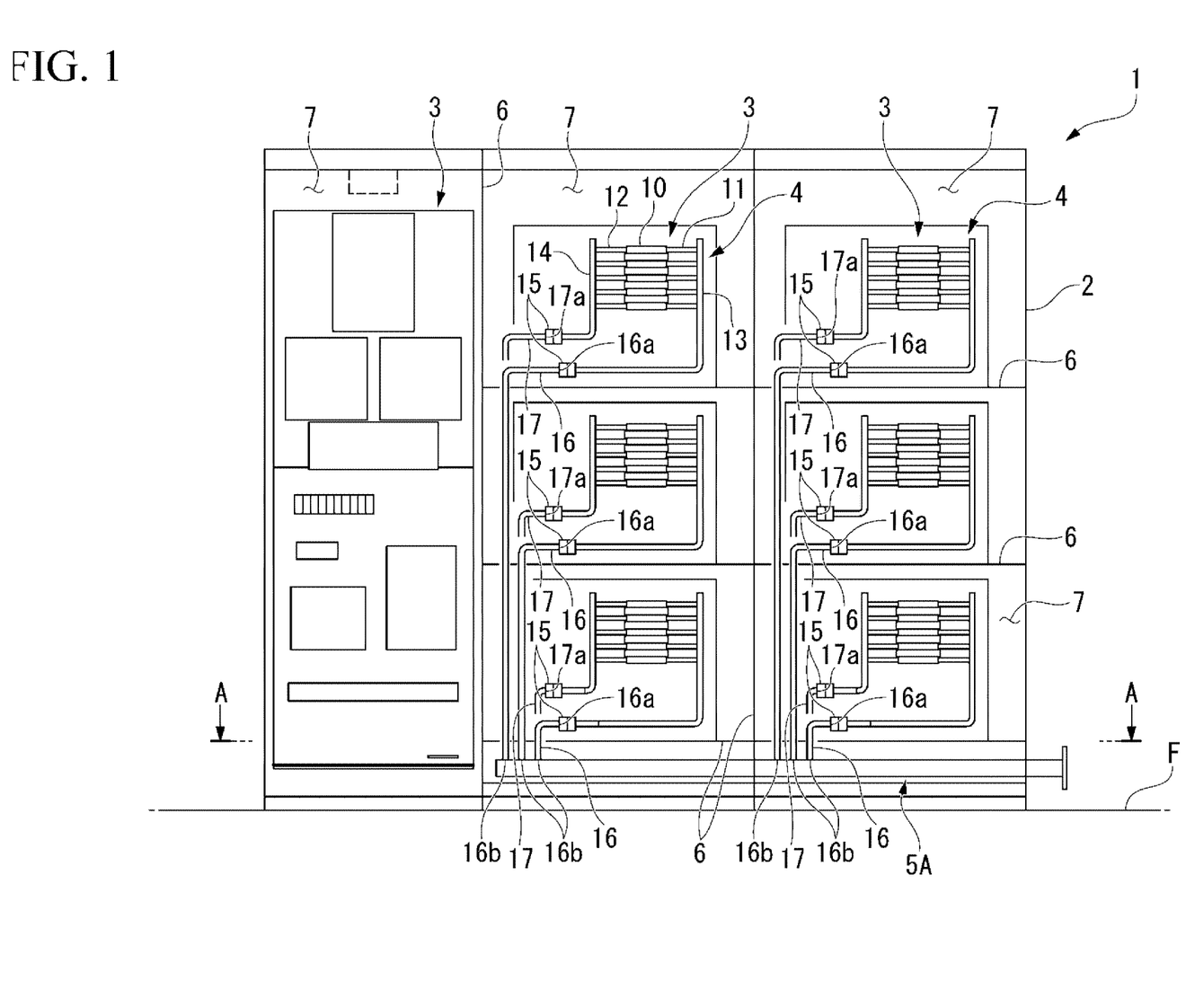
FIG. 1 is a schematic configuration view showing an electric power apparatus according to an embodiment.

FIG. 1 is a schematic configuration view of an electric power apparatus 1.

As shown in FIG. 1, the electric power apparatus 1 includes: an electric power apparatus housing (an example of an apparatus housing in the claim 2; an electrical equipment 3 accommodated in the electric power apparatus housing 2; a cooling unit 4 for cooling the electrical equipment 3; and a fluid check piping 5A and a fluid check piping 5B (a supply-side fluid check piping 5A and a discharge-side fluid check piping 5B) provided on the electric power apparatus housing 2 and connected to the cooling unit 4.

In the following description, a vertical direction and a horizontal direction in a state where the electric power apparatus 1 is disposed on a floor F are simply referred to as a vertical direction and a horizontal direction, respectively.

The inside of the electric power apparatus housing 2 is partitioned by a plurality) of partition plates 6 that extend in the vertical direction or the horizontal direction. The electrical equipment 3 is arranged in each partitioned room 7. The cooling unit 4 is provided so as to be in contact with the electrical equipment 3 on which a semiconductor element 8 having a specifically large amount of heat generation is provided among the plurality of electrical equipment. A plurality of semiconductor elements 8 are arranged, for example, side-by-side along a thickness direction of the semiconductor elements 8.

Figure 2:
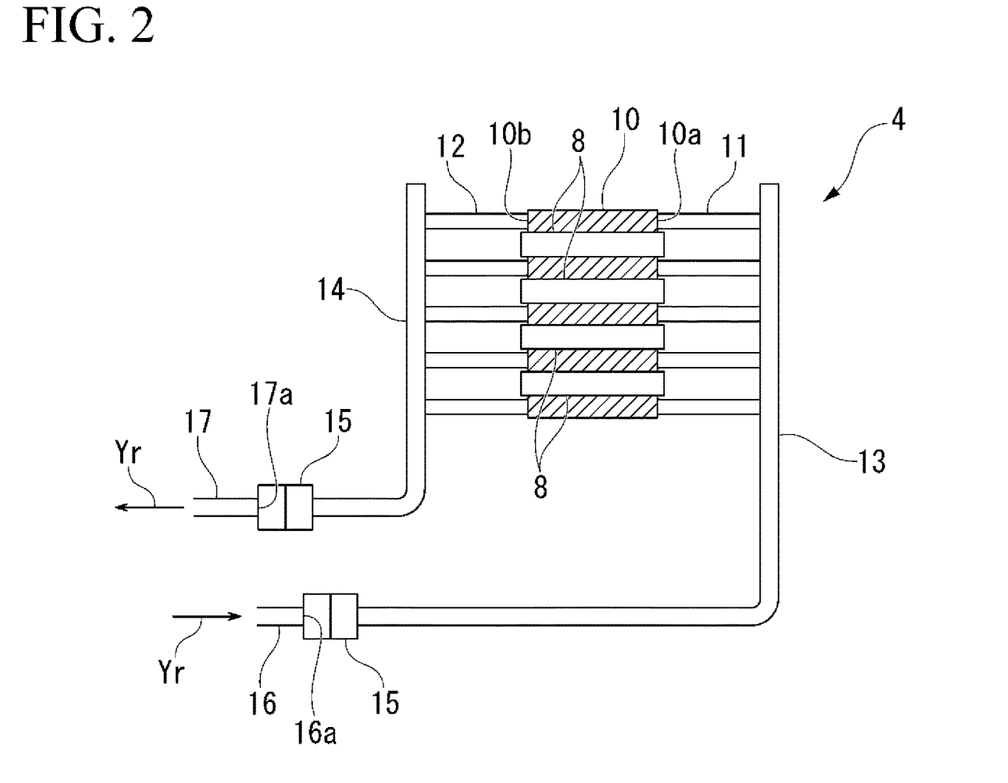
FIG. 2 is a schematic configuration view showing a cooling unit according to the embodiment.

FIG. 2 is an enlarged view of the cooling unit 4 of FIG. 1.

As shown in FIG. 1 and FIG. 2, the cooling unit 4 includes: a water-cooled type heat sink (water-cooled heat sink) 10 that is in contact with the semiconductor element 8; an inlet piping 11 and an outlet piping 12 that are connected to the heat sink 10; a supply piping 13 connected to the inlet piping 11; a discharge piping 14 connected to the outlet piping 12; a supply-side connection pipe 16 connected to the supply piping 13; and a discharge-side connection pipe 17 connected to the discharge piping 14. The pipes 11 to 17 are examples of refrigerant piping in the claims.

The heat sink 10 is formed of, for example, an aluminum plate in a plate shape. The heat sink 10 is arranged on both sides in a thickness direction of each semiconductor element 8 to sandwich the semiconductor element 8. A meandering water passage (not shown) is provided inside the heat sink 10. One end of the inlet piping 11 is connected to an inlet port 10a provided on one side in a plane direction of such a heat sink 10. One end of the outlet piping 12 is connected to an outlet port 10b provided on another side surface in the plane direction of the heat sink 10.

The supply piping 13 is connected to another end of the inlet piping 11. The discharge piping 14 is connected to another end of the outlet piping 12.

Here, the supply piping 13 and the discharge piping 14 extend along a thickness direction of the semiconductor element 8 and the heat sink 10. The other end of the inlet piping 11 and the other end of the outlet piping 12 that extend from each heat sink 10 are aligned in an extension direction of the supply piping 13 and the discharge piping 14. The other end of the inlet piping 11 and the other end of the outlet piping 12 that extend from each heat sink 10 are collectively connected to one end side of the supply piping 13 and the discharge piping 14. The heat sink 10, the inlet piping 11, the outlet piping 12, the supply piping 13, and the discharge piping 14 are in communication with one another.

As shown in FIG. 1 and FIG. 2, other end sides of the supply piping 13 and the discharge piping 14 extend to be bent to the outside of each room 7. The other end of the supply piping 13 is connected to one end 16a of the supply-side connection pipe 16 via a weld 15. The other end of the discharge piping 14 is connected to one end 17a of the discharge-side connection pipe 17 via the weld 15.

The connection pipes 16 and 17 are arranged in the vicinity of the outside of each room 7 and extend along the vertical direction. The connection pipe 16 and the connection pipe 17 are in communication with the supply pipe 13 and the discharge pipe 14, respectively. Other ends 16b and 17b of the connection pipes 16 and 17 extend to a lower portion of the electric power apparatus housing 2. A supply-side fluid check piping 5A is connected to the other end 16b of the supply-side connection pipe 16. A discharge-side fluid check piping 5B is connected to the other end 17b of the discharge-side connection pipe 17.

Figure 3:
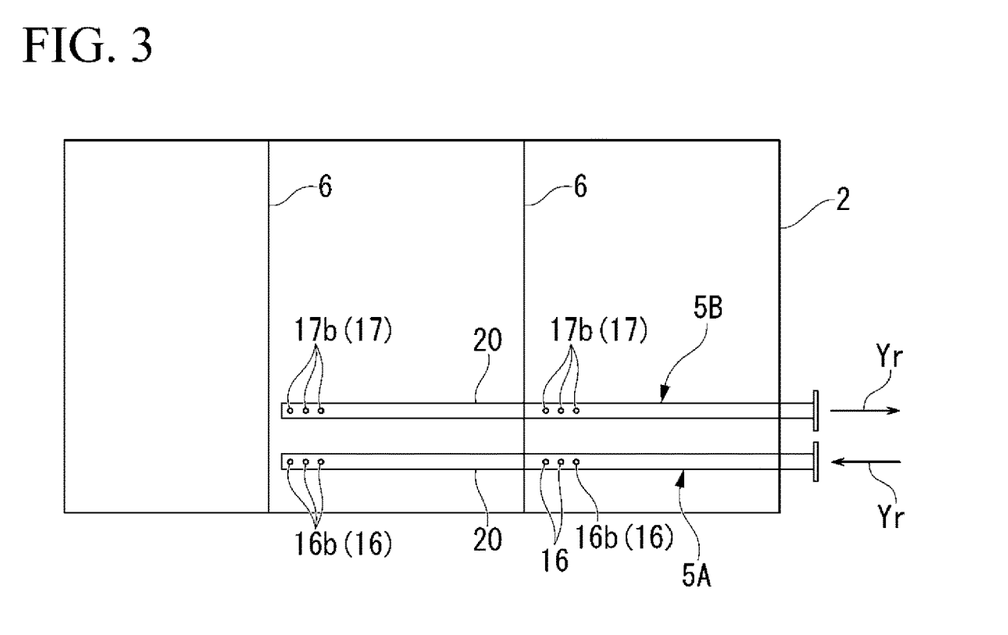
FIG. 3 is a cross-sectional view along an A-A line of FIG. 1.
Figure 4:
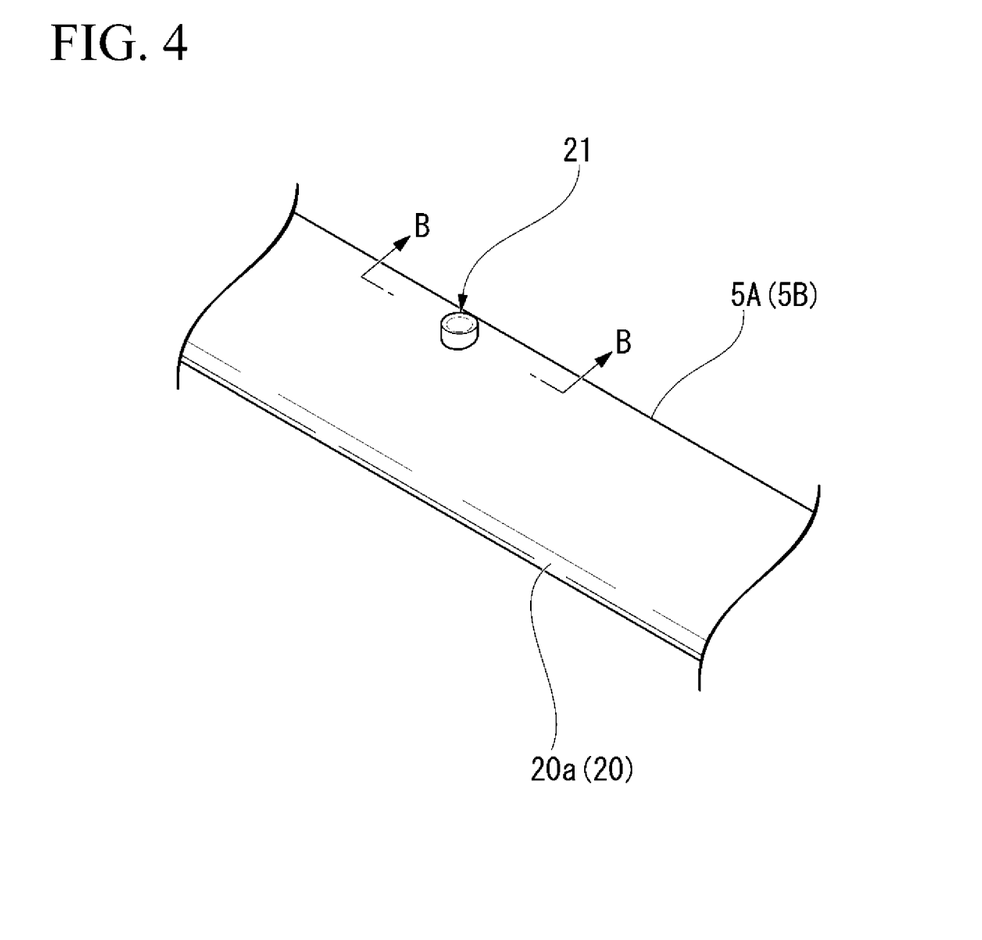
FIG. 4 is a partially enlarged perspective view showing a supply-side fluid check piping according to the embodiment.
Figure 5:
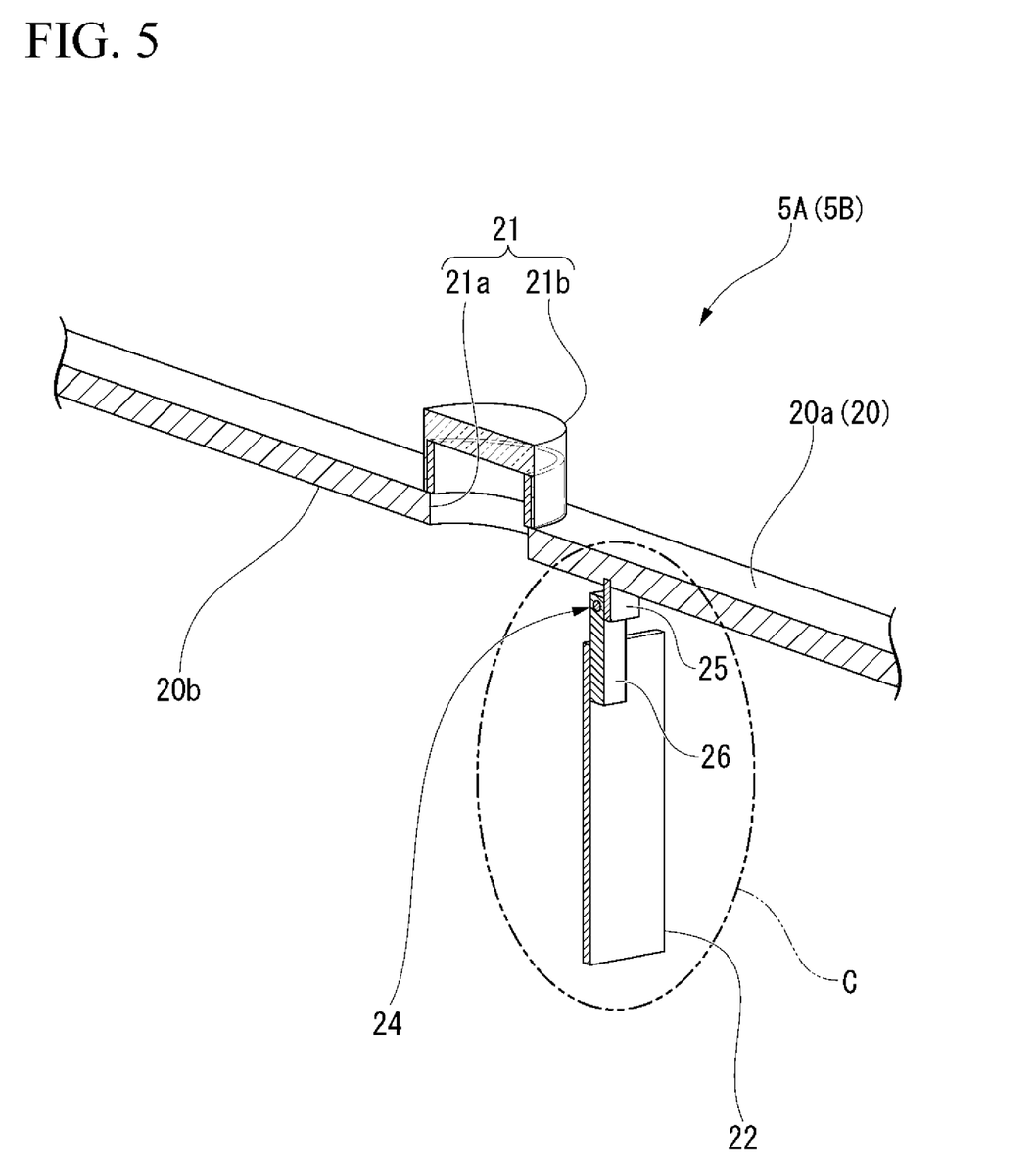
FIG. 5 is a cross-sectional view along a B-B line of FIG. 4.

FIG. 3 is a cross-sectional view along an A-A line of FIG. 1. FIG. 4 is a partially enlarged perspective view of the supply-side fluid check piping 5A (discharge-side fluid check piping 5B). FIG. 5 is a cross-sectional view along a B-B line of FIG. 4.

As shown in FIG. 1 and FIG. 3 to FIG. 5, each fluid check piping 5A and 5B is arranged on a lower portion of the electric power apparatus housing 2. Since the two fluid check pipings 5A and 5B have the same configuration, only the supply-side fluid check piping 5A among the two fluid check pipings 5A and 5B is described in the following description, the same reference numerals are given to the discharge-side fluid check piping 5B, and description thereof is omitted. If necessary, the discharge-side fluid check piping 5B is described.

The supply-side fluid check piping 5A includes a piping main body 20 that extends along the horizontal direction, a check window 21 that is provided on a circumferential wall 20a of the piping main body 20, and a check plate 22 that is provided on an inner circumferential surface 20b of the piping main body 20.

The other end 16b of the supply-side connection pipe 16 is connected to an upper portion of the circumferential wall 20a in the piping main body 20 of the supply-side fluid check piping 5A. On the other hand, the other end 17b of the discharge-side connection pipe 17 is connected to an upper portion of the circumferential wall 20a in the piping main body 20 of the discharge-side fluid check piping 5B.

The supply-side connection pipe 16 and the piping main body 20 of the supply-side fluid check piping 5A are in communication with each other. The discharge-side connection pipe 17 and the piping main body 20 of the discharge-side fluid check piping 5B are in communication with each other.

The check window 21 is provided on an upper portion of the circumferential wall 20a of the piping main body 20 and at a position that avoids each of the connection pipes 16 and 17. The check window 21 is constituted of a through-hole 21a formed to penetrate through the circumferential wall 20a of the piping main body 20 in a thickness direction and a closing part 21b having a cylindrical shape and inserted in the through-hole 21a.

The closing part 21b is formed of a transparent material. The closing part 21b is formed, for example, of an acrylic resin. The closing part 21b is fixed to the through-hole 21a, for example, by adhesion or the like. Thereby, the inside of the piping main body 20 can be viewed from the outside of the piping main body 20 through the check window 21 while ensuring the seal property between the through-hole 21a and the closing part 21b.

The closing part 21b may be fixed to the through-hole 21a while ensuring the seal property, and the fixation is not limited to fixation by adhesion. For example, a taper screw may be formed on the through-hole 21a and the closing part 21b, and the closing part 21b may be fastened and fixed to the through-hole 21a. In this case, a seal tape or the like may be used for the taper screw.

Figure 6:
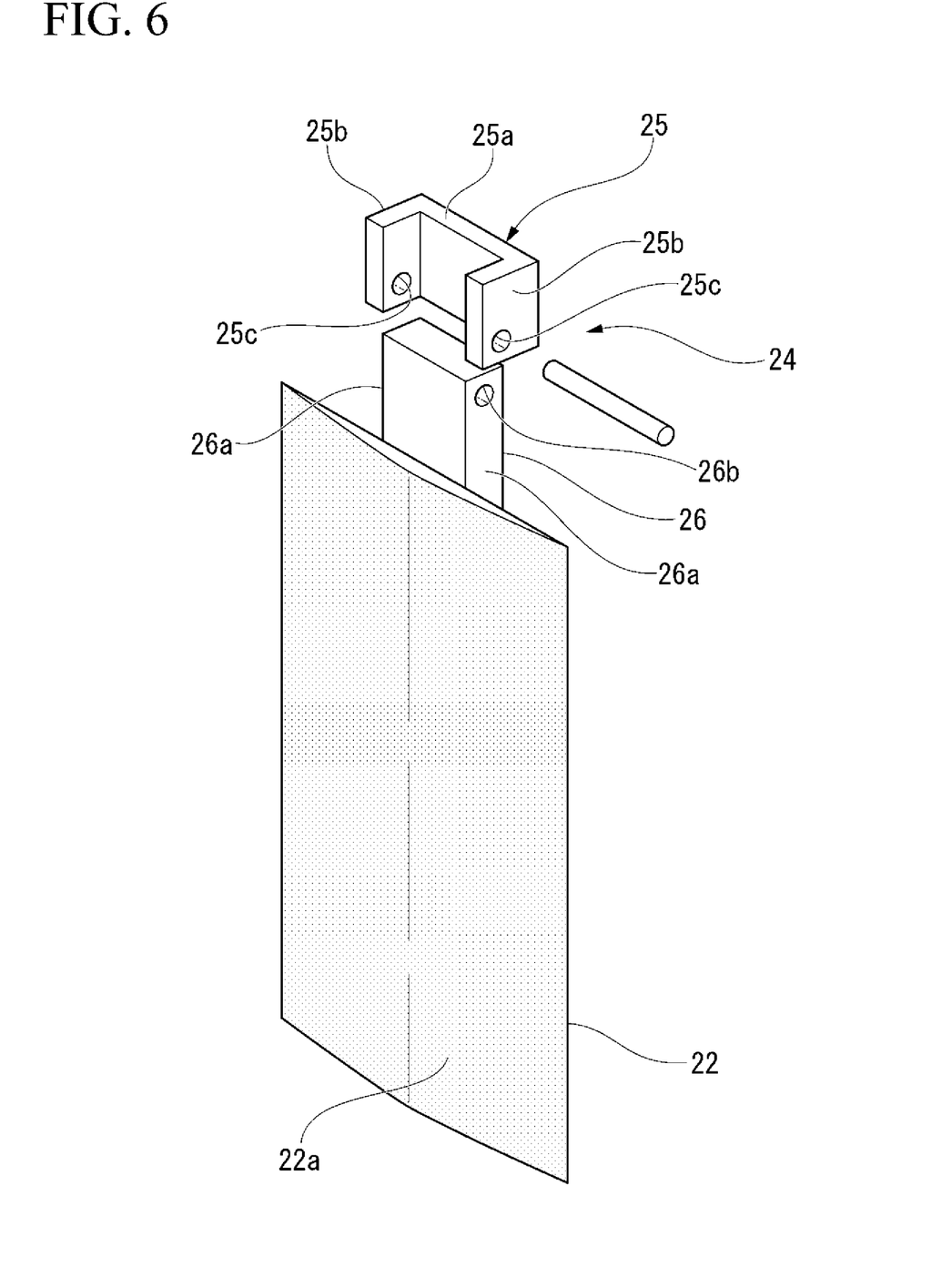
FIG. 6 is an enlarged view of a C portion of FIG. 5.

FIG. 6 is an enlarged view of a C portion of FIG. 5.

As shown in FIG. 5 and FIG. 6, the check plate 22 is rotatably supported by a connection part 24 to the inner circumferential surface 20b of the piping main body 20.

The check plate 22 is formed in a plate shape elongated in one direction. The connection part 24 is attached to one end in a longitudinal direction of the check plate 22.

The connection part 24 includes a bracket 25 fixed to the inner circumferential surface 20b of the piping main body 20, a support plate 26 fixed to the check plate 22, and a connection pin 27 that connects the bracket 25 to the support plate 26.

The bracket 25 is formed in a C shape and includes a base part 25a fixed to the inner circumferential surface 20b of the piping main body 20 and two side walls 25b that rise from both ends of the base part 25a in a circumferential direction of the piping main body 20. A pin hole 25c through which the connection pin 27 is inserted is formed on the two side walls 25b.

The support plate 26 is provided between the two side walls 25b. The support plate 26 is arranged such that a plane direction of the support plate 26 is matched with a facing direction of the two side walls 25b of the bracket 25. A pin hole 26b that penetrates through the support plate 26 in a plane direction is formed on both side surfaces 26a in the plane direction of the support plate 26. The connection pin 27 is also inserted through the pin hole 26b.

Thereby, the bracket 25 and the support plate 26 are rotatably connected to each other via the connection pin 27. As a result, the check plate 22 rotates about the connection pin 27. Since the connection pin 27 is inserted through the pin holes 25c and 26b and is thereby arranged along the circumferential direction of the piping main body 20, the check plate 22 rotates (swings) in the longitudinal direction (axis direction) of the piping main body 20. The check plate 22 droops so as to be elongated in the vertical direction by its own weight in a natural state in which no external force is applied.

Such a check plate 22 is arranged side-by-side with the check window 21 on an upstream side of the check window 21 with respect to a flow direction of cooling water that flows in the piping main body 20 described later. A color different from that of the piping main body 20 is applied to one surface 22a of the check plate 22 on the check window 21 side. The color is preferably a color that can be easily viewed by an operator. For example, the color is preferably a fluorescent color or the like which is visible even in the dark.

Next, the action of each fluid check piping 5A and 5B is described with reference to FIG. 7 and FIG. 8.

Figure 7:
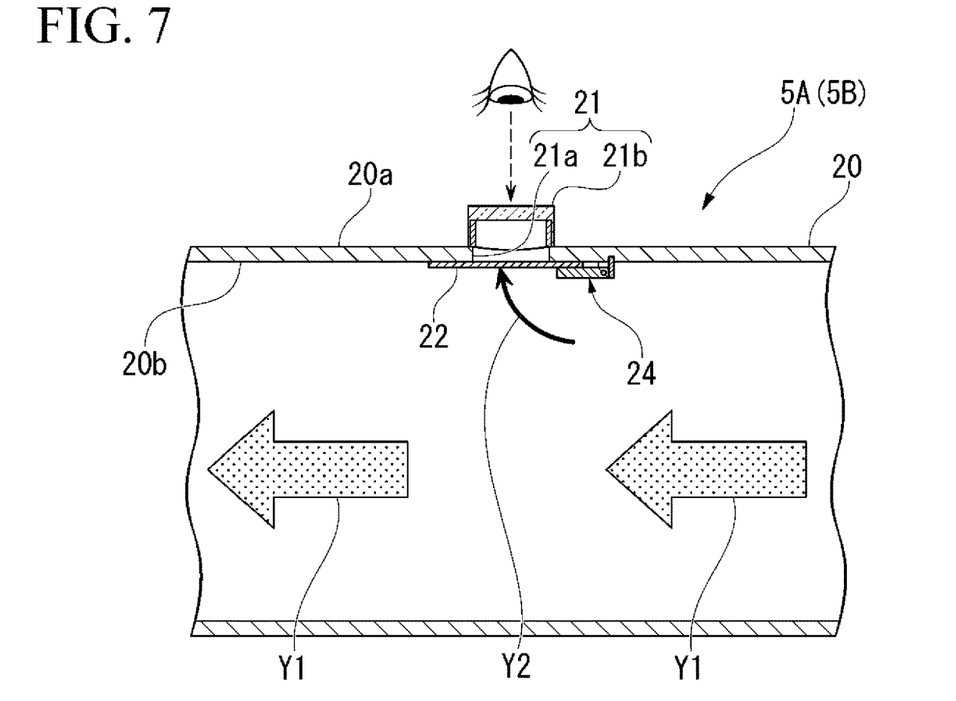
FIG. 7 is an action explanation view when cooling water is flowing in each fluid check piping according to the embodiment.
Figure 8:
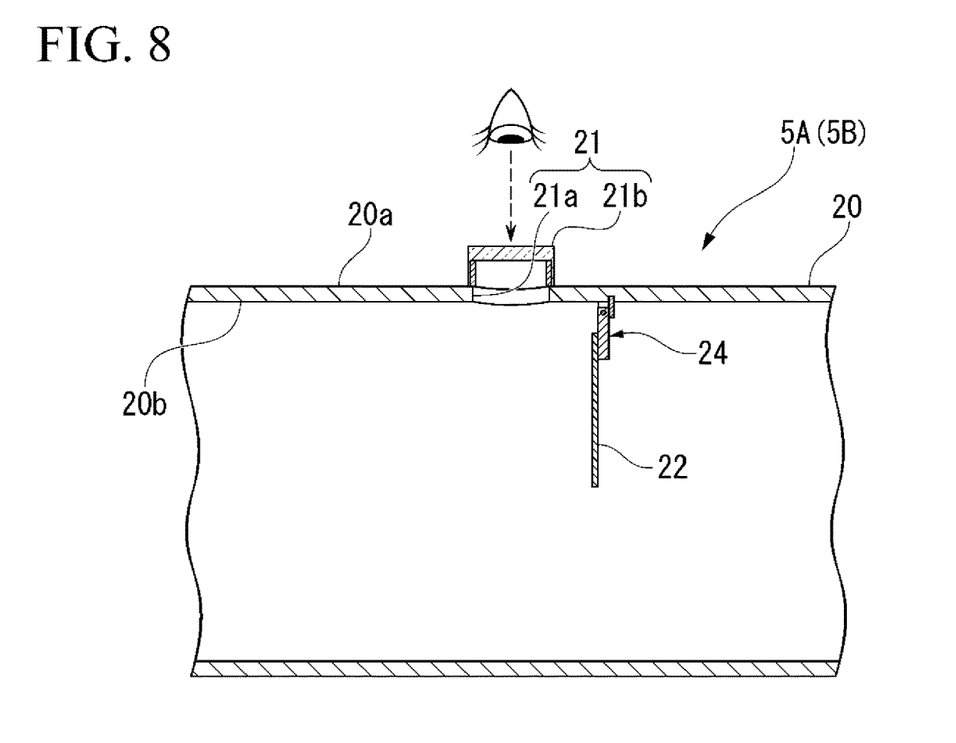
FIG. 8 is an action explanation view when cooling water is not flowing in each fluid check piping according to the embodiment.

FIG. 7 and FIG. 8 are action explanation views of each fluid check piping 5A and 5B. FIG. 7 shows a state in which cooling water is flowing, and FIG. 8 shows a state in which cooling water is not flowing.

First, when cooling water (not shown) is supplied to the piping main body 20 of the supply-side fluid check piping 5A, the cooling water flows in order of the supply-side connection pipe 16, the supply piping 13, the inlet piping 11, the heat sink 10, the outlet piping 12, the discharge piping 14, the discharge-side connection pipe 17, and the piping main body 20 of the discharge-side fluid check piping 5B (refer to an arrow Yr in FIG. 2 and FIG. 3).

That is, the other end 16b of the supply-side connection pipe 16 corresponds to an inlet of a refrigerant piping into which a liquid refrigerant flows in the claims. The other end 17b of the discharge-side connection pipe 17 corresponds to an outlet of a refrigerant piping from which the liquid refrigerant is discharged in the claims. In this way, the cooling water circulates around each portion, and thereby, the cooling of the semiconductor element 8 via the heat sink 10 is facilitated.

As shown in FIG. 7, the check plate 22 is arranged side-by-side with the check window 21 on the upstream side of the check window 21 with respect to the flow direction (refer to an arrow Y1 in FIG. 7) of the cooling water. Therefore, when the cooling water flows in the piping main body 20 of each fluid check piping 5A and 5B, the check plate 22 rotates about the connection pin 27 in response to the pressure of the cooling water and rises so as to block the check window 21 (refer to an arrow Y2 in FIG. 7).

In this state, when an operator looks at the check window 21 from the outside, the operator can check the check plate 22 through the check window 21. By checking the check plate 22, it is possible to confirm that the cooling water is flowing properly in the piping main body 20.

When the check plate 22 rises, the one surface 22a of the check plate 22 is directed to the check window 21 side. Since a color different from that of the piping main body 20 is applied to the single surface 22a, it is easy for the operator to check the check plate 22.

On the other hand, for example, if any of the piping main body 20 of the supply-side fluid check piping 5A, the supply-side connection pipe 16, the supply piping 13, the inlet piping 11, the heat sink 10, the outlet piping 12, the discharge piping 14, the discharge-side connection pipe 17, and the piping main body 20 of the discharge-side fluid check piping 5B are clogged by foreign substances or the like, the cooling water does not flow properly in each piping main body 20, and the flow of the cooling water is stopped.

In such a case, as shown in FIG. 8, the pressure of the cooling water is not applied to the check plate 22, and the check plate 22 remains drooping due to its own weight. Therefore, even if an operator looks at the check window 21 from the outside, the operator cannot check the check plate 22 through the check window 21. As a result, the operator can determine if any of the piping main body 20 of the supply-side fluid check piping 5A, the supply-side connection pipe 16, the supply piping 13, the inlet piping 11, the heat sink 10, the outlet piping 12, the discharge piping 14, the discharge-side connection pipe 17, and the piping main body 20 of the discharge-side fluid check piping 5B are clogged by foreign substances or the like.

In this way, the electric power apparatus 1 described above includes the fluid check pipings 5A and 5B. The fluid check pipings 5A and 5B include the piping main body 20 that extends along the horizontal direction, the check window 21 that is provided on the circumferential wall 20a of the piping main body 20, and the check plate 22 that is provided on the inner circumferential surface 20b of the piping main body 20. Therefore, it is possible to reliably confirm whether or not any of the piping main body 20 of the supply-side fluid check piping 5A, the supply-side connection pipe 16, the supply piping 13, the inlet piping 11, the heat sink 10, the outlet piping 12, the discharge piping 14, the discharge-side connection pipe 17, and the piping main body 20 of the discharge-side fluid check piping 5B are clogged due to foreign substances or the like. Further, since only the check plate 22 is rotatably provided on the inner circumferential surface 20b of the piping main body 20, it is possible to manufacture each fluid check piping 5A and 5B with a low cost.

A color different from that of the piping main body 20 is applied to the one surface 22a of the check plate 22 on the check window 21 side. When the check plate 22 rises, the one surface 22a faces the check window 21 side. Therefore, the operator can easily check the check plate 22. As a result, it is possible to further easily check the flow of cooling water in the piping main body 20 of the supply-side fluid check piping 5A, the supply-side connection pipe 16, the supply piping 13, the inlet piping 11, the heat sink 10, the outlet piping 12, the discharge piping 14, the discharge-side connection pipe 17, and the piping main body 20 of the discharge-side fluid check piping 5B.

The above embodiment is described using a case in which the fluid check pipings 5A and 5B are employed in the electric power apparatus 1. However, the embodiment is not limited thereto, and the fluid check pipings 5A and 5B can be applied to a variety of devices. The piping main body 20 of the fluid check pipings 5A and 5B may be arranged along the horizontal direction.

The above embodiment is described using a case in which the cooling unit 4 is a so-called water-cooled type in which cooling water is used as a refrigerant. However, the embodiment is not limited thereto, and the refrigerant may be a fluid. For example, a gas can also be used. It is desirable to change the weight of the check plate 22 depending on the fluid. When a gas is used as a refrigerant, by relatively lightening the weight of the check plate 22, the check plate 22 easily flaps (easily rises).

The above embodiment is described using a case in which the check plate 22 is rotatably supported via the connection part 24 by the inner circumferential surface 20b of the piping main body 20 in each fluid check piping 5A and 5B. However, the embodiment is not limited thereto. The connection part 24 may be able to rotatably support the check plate 22 in a range in which the check plate 22 is raised so as to block the check window 21 in response to the pressure of the fluid from a state in which the check plate 22 droops by its own weight.

The above embodiment is described using a case in which a color different from that of the piping main body 20 is applied to the one surface 22a of the check plate 22. However, the embodiment is not limited thereto, and a color different from that of the piping main body 20 may be applied to both surfaces of the check plate 22.

According to at least one embodiment described above, since the fluid check pipings 5A and 5B include the piping main body 20 that extends along the horizontal direction, the check window 21 that is provided on the circumferential wall 20a of the piping main body 20, and the check plate 22 that is provided on the inner circumferential surface 20b of the piping main body 20, it is possible to easily check the flow of cooling water in the piping main body 20. Further, since only the check plate 22 is rotatably provided on the inner circumferential surface 20b of the piping main body 20, it is possible to manufacture each fluid check piping 5A and 5B with a low cost.

Since a color different from that of the piping main body 20 is applied to the one surface 22a of the check plate 22 on the check window 21 side, the operator can easily check the check plate 22. As a result, it is possible to further easily check the flow of cooling water in the piping main body 20.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

1 Electric power apparatus
2 Electric power apparatus housing (apparatus housing)
3 Electrical equipment
5A Supply-side fluid check piping (fluid check piping)
5B Discharge-side fluid check piping (fluid check piping)
8 Semiconductor element (electrical equipment)
11 Inlet piping (refrigerant piping)
12 Outlet piping (refrigerant piping)
13 Supply piping (refrigerant piping)
14 Discharge piping (refrigerant piping)
16 Supply-side connection pipe (refrigerant piping)
16b Other end (inlet)
17 Discharge-side connection pipe (refrigerant piping)
17b Other end (outlet)
20 Piping main body
20a Circumferential wall
21 Check window
22 Check plate
22a One surface

The invention claimed is:

1. An electric power apparatus, comprising:
a fluid check piping;
an apparatus housing in which the fluid check piping is provided;
an electrical equipment accommodated in the apparatus housing; and
a refrigerant piping that is provided in the apparatus housing and cools the electrical equipment using a liquid refrigerant,
wherein the fluid check piping comprises:
    a piping main body which is arranged along a horizontal direction and in which the liquid refrigerant flows through an inside of the piping main body;
    a check window which is provided on an upper portion of a circumferential wall of the piping main body and through which an inside of the piping main body is capable of being viewed from an outside of the piping main body; and
    a check plate that is provided on an inner circumferential surface of the piping main body, that is rotatably arranged side-by-side with the check window, that droops by its own weight, and that rises so as to block the check window in response to a pressure of the liquid refrigerant, and
the fluid check piping is connected to at least any one of an inlet of the refrigerant piping in which the liquid refrigerant flows and an outlet from which the liquid refrigerant is discharged.

2. The electric power apparatus according to claim 1, wherein a color of at least one surface of the check plate on a side of the check window is different from a color of the piping main body.

* * * * *